(12) United States Patent
Ito

(10) Patent No.: US 8,129,087 B2
(45) Date of Patent: Mar. 6, 2012

(54) BLOCK COPOLYMER AND SUBSTRATE PROCESSING METHOD

(75) Inventor: Toshiki Ito, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 339 days.

(21) Appl. No.: 12/482,345

(22) Filed: Jun. 10, 2009

(65) Prior Publication Data

US 2009/0311637 A1 Dec. 17, 2009

(30) Foreign Application Priority Data

Jun. 12, 2008 (JP) .................................. 2008-154647

(51) Int. Cl.
*G03F 7/00* (2006.01)
*G03F 7/004* (2006.01)
*C07F 9/22* (2006.01)
*C07C 61/00* (2006.01)
*C07C 63/00* (2006.01)

(52) U.S. Cl. ........... 430/270.1; 562/8; 562/15; 562/400; 562/405; 562/435

(58) Field of Classification Search ............... 430/270.1; 562/15, 8, 400, 405, 435
See application file for complete search history.

(56) References Cited

U.S. PATENT DOCUMENTS

| | | | | |
|---|---|---|---|---|
| 7,189,435 B2 * | 3/2007 | Tuominen et al. | ............ | 427/472 |
| 7,425,436 B2 * | 9/2008 | Darzins et al. | ................. | 435/195 |
| 7,479,362 B2 * | 1/2009 | Fukushima et al. | ....... | 430/270.1 |
| 7,682,703 B2 * | 3/2010 | Frey et al. | ..................... | 428/544 |
| 7,732,119 B2 * | 6/2010 | Afzali-Ardakani et al. | .......................... | 430/270.1 |
| 7,888,528 B2 * | 2/2011 | Afzali-Ardakani et al. | .... | 562/15 |
| 7,901,866 B2 * | 3/2011 | Ito | .............................. | 430/270.1 |
| 2006/0241071 A1 * | 10/2006 | Grinstaff et al. | ................ | 514/44 |
| 2009/0191713 A1 * | 7/2009 | Yoon et al. | ..................... | 438/703 |
| 2010/0255487 A1 * | 10/2010 | Beechem et al. | ................. | 435/6 |
| 2011/0003343 A1 * | 1/2011 | Nikiforov et al. | ............ | 435/91.5 |
| 2011/0147985 A1 * | 6/2011 | Cheng et al. | .................. | 264/225 |

FOREIGN PATENT DOCUMENTS

JP 2002-287377 A 10/2002

OTHER PUBLICATIONS

P. Mansky et al., "Nanolithographic templates from diblock copolymer thin films", Appl. Phys. Letters, vol. 68, No. 18, Apr. 29, 1996, pp. 2586-2588.

* cited by examiner

*Primary Examiner* — Amanda C. Walke
(74) *Attorney, Agent, or Firm* — Canon U.S.A., Inc. IP Division

(57) ABSTRACT

A block copolymer that can form selectively a microphase-separated structure under exposure with an ultraviolet exposure device, and a substrate processing method by which a micropattern can be formed at a low cost on the substrate by using the block copolymer. The block copolymer has as a basic skeleton a hydrophobic block that has a repeating structure of a hydrophobic monomer and a hydrophilic block that has a repeating structure of a hydrophilic monomer having a hydrophilic functional group. At least some of the hydrophilic functional groups are covered with a hydrophobic protective group and the hydrophobic protective group, which covers the hydrophilic functional group, is dissociated from the hydrophilic functional group by light irradiation. The substrate processing method uses the block copolymer to form a micropattern on the substrate.

8 Claims, 3 Drawing Sheets

105 BLOCK COPOLYMER LAYER THAT HAS NOT BEEN PHASE SEPARATED
106 PHASE-SEPARATED BLOCK COPOLYMER LAYER

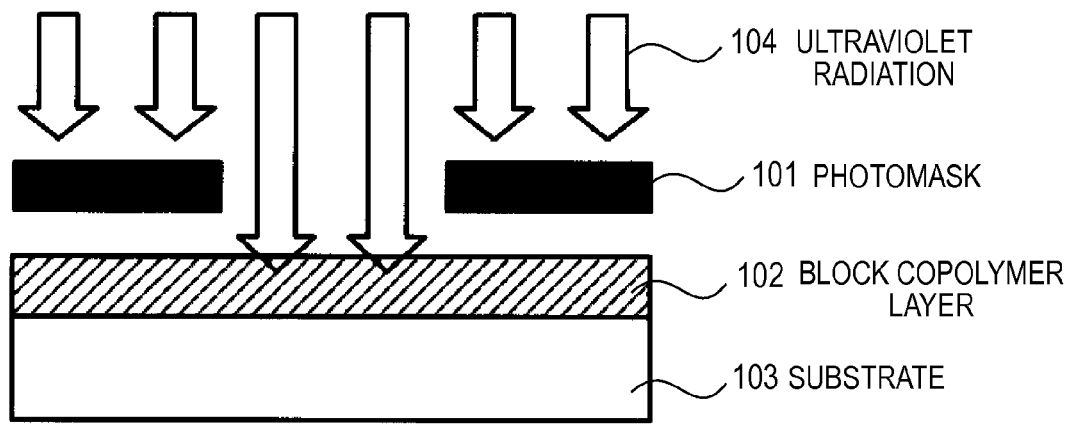
FIG.1A EXPOSURE
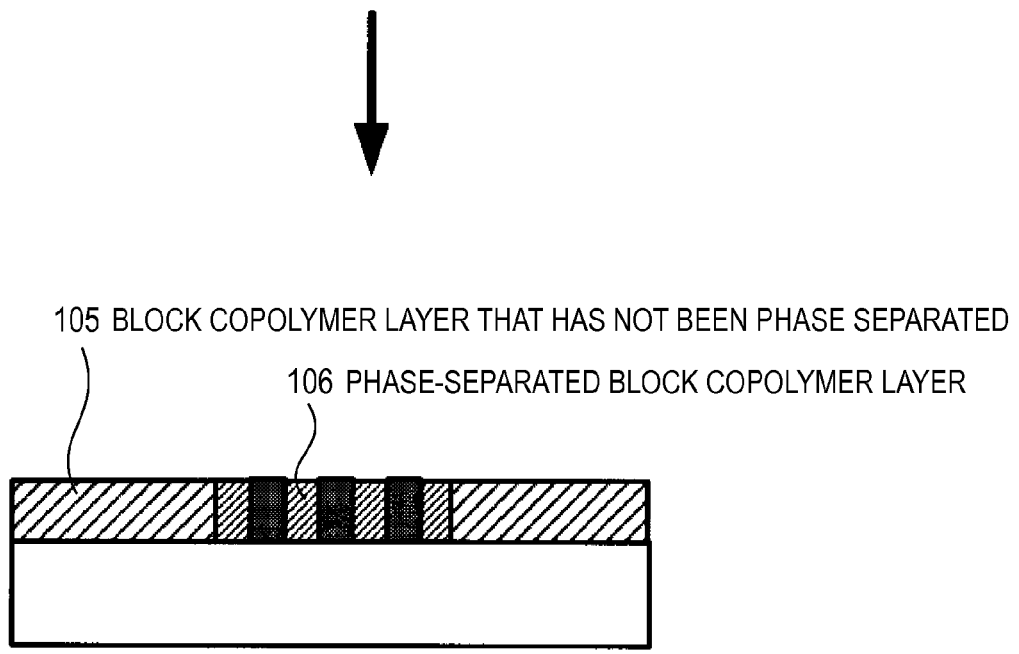
FIG.1B ANNEALING

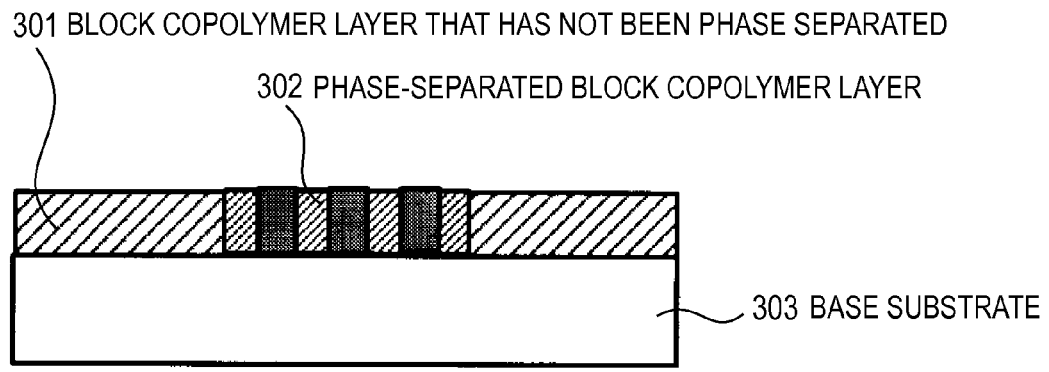
FIG.3A
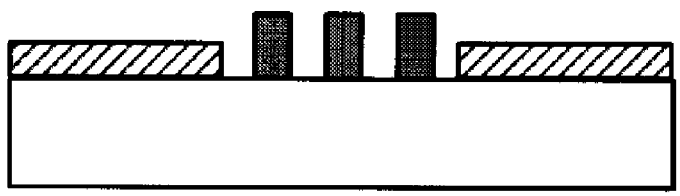
FIG.3B SELECTIVE REMOVAL
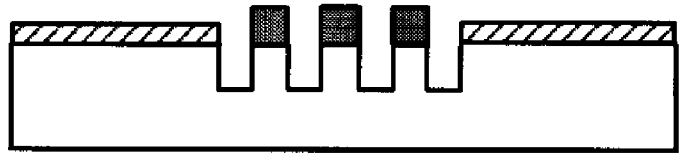
FIG.3C SUBSTRATE PROCESSING

BLOCK COPOLYMER AND SUBSTRATE PROCESSING METHOD

BACKGROUND OF THE INVENTION

1. Field of the Invention

The present invention relates to block copolymer and a substrate processing method, and more particularly to a photosensitive block copolymer and a substrate processing method by which a micropattern is formed by radiation exposure that uses the photosensitive block copolymer.

2. Description of the Related Art

In the field of electronic devices that require nanoorder microprocessing, starting with semiconductor devices, a demand has been growing for increased density and degree of integration of the devices.

A photolithographic process plays the most important role in forming microcircuit patterns in fabrication of semiconductor devices. Most photolithographic processes are presently implemented by reduction projection exposure, but the resolution of such process is limited by a light diffraction limit and is about one third of the light source wavelength. For this reason, the wavelength is decreased by using an excimer laser for an exposure light source, thereby making it possible to conduct microprocessing of an order of 100 nm.

The photolithography advances miniaturization, but also raises a large number of issues that have to be resolved as the light source wavelength is reduced, for example, the increase in the device size, the necessity to develop lenses for the wavelength range, the device cost, and the corresponding resist cost. Furthermore, the aforementioned optical devices require processing that is at least as inexpensive as that of the semiconductor devices.

A method for obtaining a self-structured configuration of microparticles and a method using a microphase-separated structure formed by a block copolymer are known as inexpensive and simple micropatterning methods serving as alternatives for the photolithographic technology (Appl. Phys. Lett., 2586, 68 (1996)).

The method using a microphase-separated structure makes it possible to form a uniform nanostructure over the entire surface of a substrate.

Japanese Patent Laid-Open No. 2002-287377 disclosed the following two methods aimed at the formation of a nanostructure only in the desired position on a substrate.

With the first method, a predetermined area of a block copolymer film is irradiated with a high-energy beam such as an electron beam, thereby cutting (or crosslinking) a polymer chain, and then annealing is performed at a temperature equal to or higher than the glass transition temperature of the block copolymer. With this method a microphase-separated structure is not formed in the irradiated area (or non-irradiated area).

With the second method, an acid is generated by irradiating a predetermined area of a block copolymer film having a radiation-sensitive acid-generating agent added thereto with radiation and then annealing at a temperature equal to or higher than the glass transition temperature of the block copolymer. During annealing, a dissociation reaction (or a polymer chain crosslinking reaction) of a hydrophobic protective group using the generated acid as a catalyst is induced in the irradiated area. As a result, a microphase-separated structure is formed only in the irradiated area (or only in the non-irradiated area).

In the microphase-separated structure formed by these two methods, at least one block is selectively removed by dry etching, wet etching, or ozone ashing, and the underlying substrate is processed by using the remaining blocks and the area where the microphase-separated structure has not been formed as a mask, thereby making it possible to produce a substrate in which a nanostructure is formed only in the desired positions.

However, the first method disclosed in Japanese Patent Laid-Open No. 2002-287377 requires an expensive high-energy beam irradiation device such as electron beam lithography device. The problem associated with the second method is that an acid generated under irradiation serves as a catalyst and side reactions such as modification of the block copolymer or corrosion of the substrate occur during the annealing.

SUMMARY OF THE INVENTION

The invention has been created with consideration for the above-described problems inherent to the background art and provides a block copolymer that is suitable for selectively forming a microphase-separated structure with the use of an ultraviolet exposure device.

The invention also provides a substrate processing method by which a micropattern can be formed on a substrate at a low cost by using the phase separation ability of the block copolymer.

The block copolymer provided by the invention has as a basic skeleton a hydrophobic block that has a repeating structure of a hydrophobic monomer and a hydrophilic block that has a repeating structure of a hydrophilic monomer having a hydrophilic functional group, wherein at least some of the hydrophilic functional groups are covered with a hydrophobic protective group and the hydrophobic protective group is dissociated from the hydrophilic functional group by light irradiation.

The method for processing a substrate provided by the invention includes: coating the block copolymer according to the invention on the substrate; exposing by selectively irradiating the block copolymer with radiation; performing a heat treatment at a temperature that is equal to or higher than a glass transition temperature of the hydrophobic block and the hydrophilic block of the block copolymer and equal to or lower than a thermal decomposition temperature of a hydrophobic protective group that covers the hydrophilic functional group and performing phase separation, on the basis of the hydrophobic block and the hydrophilic block, of the region where the block copolymer has been exposed; selectively removing one block from among the phase separated hydrophobic block and hydrophilic block; and processing the substrate by using as a mask the other block that remains on the substrate.

The invention can provide a block copolymer that is suitable for selectively forming a microphase-separated structure with the use of an ultraviolet exposure device.

The invention also can provide a substrate processing method by which a micropattern can be formed on a substrate at a low cost by using the phase separation ability of the block copolymer.

Further features of the present invention will become apparent from the following description of exemplary embodiments with reference to the attached drawings.

BRIEF DESCRIPTION OF THE DRAWINGS

FIGS. 1A and 1B are process diagrams illustrating a process of position-selectively forming a microphase-separated structure by using the block copolymer in accordance with the invention;

FIGS. 3A to 3C are process diagrams illustrating a substrate processing method using the phase-separated structure in accordance with the invention.

DESCRIPTION OF THE EMBODIMENTS

Figure 2:
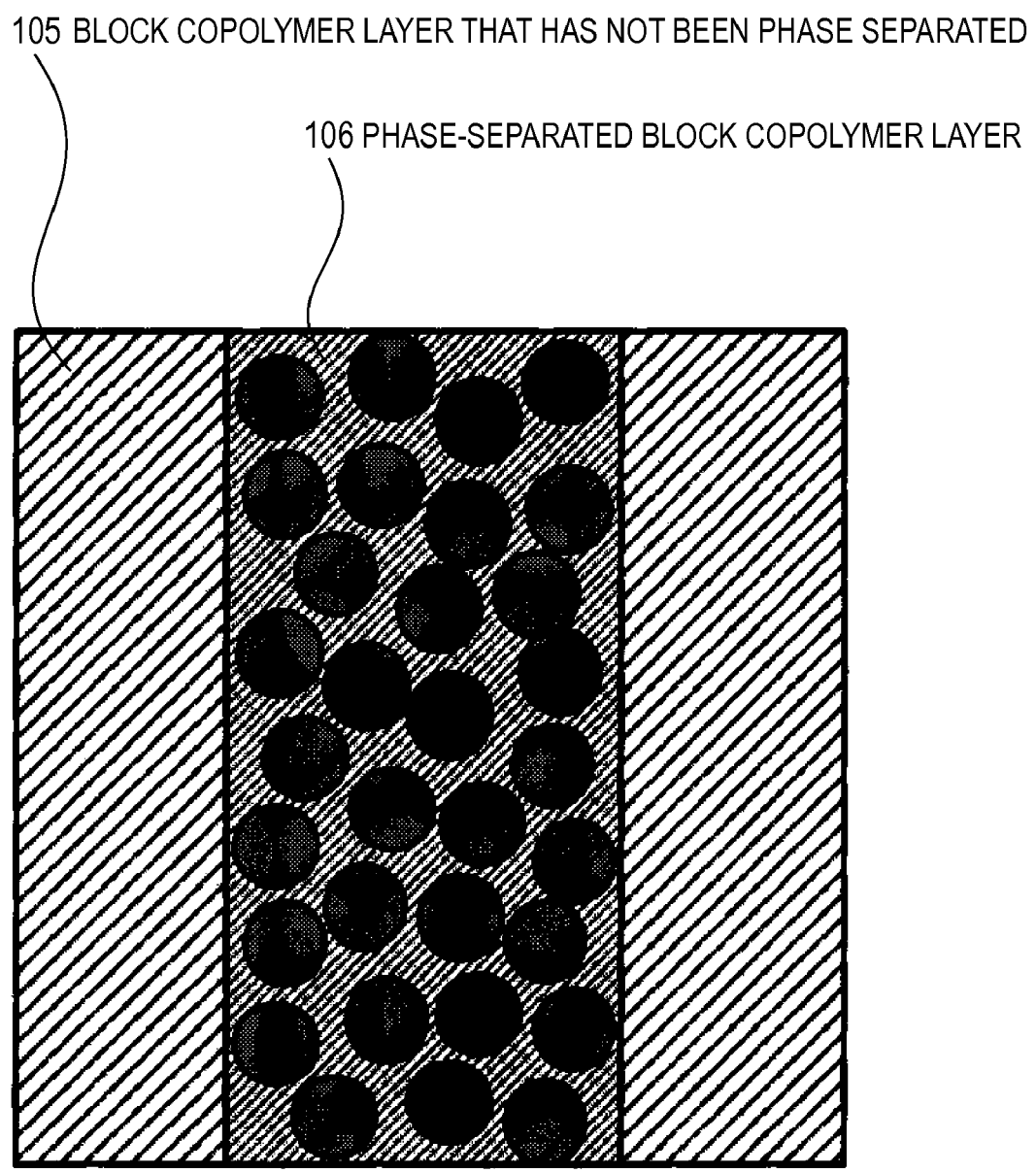
FIG. 2 is a plan view of a substrate where a microphase-separated structure has been position-selectively formed.

The invention will be described below in greater detail.

The block copolymer in accordance with the invention has as a basic skeleton a hydrophobic block that has a repeating structure of a hydrophobic monomer and a hydrophilic block that has a repeating structure of a hydrophilic monomer having a hydrophilic functional group. At least some of the hydrophilic functional groups are covered with a hydrophobic protective group and the hydrophobic protective group is dissociated from the hydrophilic functional group by light irradiation.

In accordance with the invention, it is preferred that the hydrophilic block covered with the hydrophobic protective group and the hydrophobic block be mutually compatible.

The hydrophobic protective group is preferably a nitrobenzyl group in which some hydrogen atoms may be substituted with a halogen element or an alkyl group.

The hydrophobic protective group is preferably a coumarinyl methyl group in which some hydrogen atoms may be substituted with a halogen element or an alkyl group.

The hydrophobic protective group is preferably a benzoin group in which some hydrogen atoms may be substituted with a halogen element or an alkyl group.

The hydrophobic protective group is preferably a fluorenecarbonyl group in which some hydrogen atoms may be substituted with a halogen element or an alkyl group.

The hydrophobic protective group is preferably a xanthenecarbonyl group in which some hydrogen atoms may be substituted with a halogen element or an alkyl group.

The substrate processing method in accordance with the invention uses the block copolymer in accordance with the invention.

The method in accordance with the invention includes the following processes.

First, the block copolymer is coated on the substrate and exposure is performed by selectively irradiating the block copolymer with radiation.

Then, a heat treatment is performed at a temperature that is equal to or higher than a glass transition temperature of the hydrophobic block and the hydrophilic block of the block copolymer and equal to or lower than a thermal decomposition temperature of the hydrophobic protective group that covers the hydrophilic functional group. As a result, the region where the block copolymer has been exposed is phase separated on the basis of the hydrophobic block and the hydrophilic block.

Then, one block from among the phase separated hydrophobic block and hydrophilic block is selectively removed and the substrate is processed by using as a mask the other block that remains on the substrate.

The block copolymer in accordance with the invention has a basic skeleton constituted by a hydrophobic block and a hydrophilic block that has a hydrophilic functional group, and some of the hydrophilic functional groups or all the hydrophilic functional groups are protected with a hydrophobic protective group. In the present description, the block copolymer in accordance with the invention in a state in which the hydrophobic protective groups are not added is called "a basic skeleton".

The block copolymer in accordance with the invention preferably has a structure in which all the blocks are mutually compatible in an equilibrium state.

In a case where at least some of the hydrophilic functional groups of the hydrophilic blocks having a repeating structure of a hydrophilic monomer having the hydrophilic function group are covered with a hydrophobic protective group, the hydrophilic block covered with the hydrophobic protective group and the hydrophobic block can be mutually compatible. As a result, because the copolymer is in a state in which the hydrophobic protective group is added, a microphase-separated structure is not formed.

The following two methods can be used to synthesize the block copolymer in accordance with the invention.

With the first method, a hydrophobic monomer and a hydrophilic monomer having a hydrophilic functional group are polymerized by the below-described polymerization method to obtain a block copolymer, and then the hydrophilic functional group is protected with a hydrophobic protective group.

With the second method a hydrophilic functional group of a hydrophilic monomer having the hydrophilic functional group is protected with a hydrophobic protective group, and then the hydrophilic monomer and a hydrophobic monomer are polymerized by the below-described polymerization method to obtain a block copolymer.

A method for position-selectively forming a microphase-separated structure by using the block copolymer in accordance with the invention will be described below.

FIG. 1 is a process diagram illustrating a process of position-selectively forming a microphase-separated structure by using the block copolymer in accordance with the invention.

As shown in FIG. 1A, the block copolymer in accordance with the invention is coated on a substrate 103, and the substrate 103 on which a block copolymer layer 102 has been formed is prepared. The substrate 103 is exposed in a patterned manner to ultraviolet light 104 by using a photomask 101.

A heat treatment (annealing) is then performed at a temperature that is equal to or higher than a glass transition temperature of the hydrophobic block and the hydrophilic block of the block copolymer and equal to or lower than a thermal decomposition temperature of the hydrophobic protective group that covers the hydrophilic functional group. As a result, a microphase-separated structure is position-selectively formed only in the exposed portion (see FIG. 1B).

FIG. 2 is a plan view of the substrate where the micro-phase separated structure has been position-selectively formed. The reference numeral 105 denotes a block copolymer layer that has not been phase separated, and the reference numeral 106 denotes a block copolymer layer that has been phase separated.

A method for processing the substrate obtained by forming a micropattern on a substrate by using the phase separation property of the block copolymer in accordance with the present invention will be explained below. FIG. 3 is a process diagram of a method for processing a substrate by using the phase-separated structure in accordance with the invention.

Referring to FIG. 3, a block copolymer layer 301 that has not been phase separated and a phase-separated block copolymer layer 302 are formed in the block copolymer (see FIG. 3A).

One block in the block copolymer layer 302 that has been phase separated in the exposed portion is selectively removed by dry etching or the like (see FIG. 3B). In this case, the block copolymer layer 301 that has not been phase separated in the unexposed portion remains. The underlying substrate 303 is etched by using the remaining block of the exposed portion and the block copolymer layer remaining in the unexposed portion as a mask, and a substrate in which a microstructure is position-selectively formed is obtained (see FIG. 3C).

EXAMPLES

The invention will be described below in greater detail with reference to specific examples thereof.

The invention uses a block copolymer having as a basic skeleton a hydrophobic block that has a repeating structure of a hydrophobic monomer and a hydrophilic block that has a repeating structure of a hydrophilic monomer having a hydrophilic functional group.

Examples of the monomer forming the hydrophobic block of the block copolymer in accordance with the invention include vinyl aromatic monomers such as styrene and alkyl derivatives thereof, for example:

(1) 4-butylstyrene, α-methylstyrene, vinyl toluene, and vinyl naphthalene;

(2) ethylene, propylene, butadiene, dimethylbutadiene, isoprene, 1,3-hexadiene, isobutylene, and chloroprene;

(3) propylene oxide;

(4) a $C_{2-10}$ alkyl, $C_{6-10}$ aryl, or $C_{6-10}$ aralkyl acrylate or a $C_{2-10}$ alkyl, $C_{6-10}$ aryl, or $C_{6-10}$ aralkyl methacrylate, for example, ethyl, n-butyl, 2-ethylhexyl, tert-butyl, isobornyl, phenyl, or benzyl (meth)acrylate;

(5) a vinyl monomer that was fluorinated or has a perfluoro chain, for example, a fluoroalkyl acrylate, a fluoroalkyl methacrylate, and alkyl α-fluoroacrylate;

(6) vinyl acetate;

(7) a $C_{1-6}$ alkyl vinyl ether or $C_{1-6}$ alkyl allyl ether;

(8) acrylonitrile, vinyl chloride, vinylidene chloride, and caprolactone;

(9) dimethylsiloxane, methylphenylsiloxane, and diphenylsiloxane;

(10) methylphenylsilane, diphenylsilane, methylchloromethylphenylsilane, dihexylsilane, propylmethylsilane, dibutylsilane, methylsilane, and phenylsilane. These monomers may be used individually or in the form of a mixture including two or more different monomers.

Examples of the hydrophilic monomer forming the hydrophilic block in the basic skeleton of the block copolymer in accordance with the invention include monomers having a hydrophilic functional group such as a carboxyl group, a sulfo group, a hydroxyl group, and an amino group. Examples of such monomers include:

(1) acrylic acid, methacrylic acid, itaconic acid, fumaric acid, crotonic acid, and maleic acid as monomers having a carboxyl group;

(2) 2-acrylamide-2-methylpropanesulfonic acid, styrenesulfonic acid, and vinylsulfonic acid as monomers having a sulfo group;

(3) a hydroxyalkyl acrylate, a hydroxyalkyl methacrylate, polyethylene glycol acrylate, polyethylene glycol methacrylate, and vinyl acrylate as monomers having a hydroxyl group; and (4) vinylamine, acrylamide, and methacrylamide as monomers having an amino group. These monomers may be used individually or in the form of a mixture including two or more different monomers.

The block copolymer can be synthesized by a variety of polymerization methods, for example, a living polymerization method.

With the living polymerization method, the block copolymer can be synthesized by initiating the polymerization with a polymerization initiator that generates one monomer as an anion, a cation, or a radical, and successively adding the other monomer.

In the living polymerization method, the molecular weight or copolymerization ratio can be accurately controlled and a block copolymer with a narrow molecular weight distribution can be synthesized.

When the living polymerization method is used, it is preferred that a solvent be sufficiently dried with a drying agent such as metallic sodium and that oxygen be prevented from admixing by a method such as freeze drying or bubbling with an inactive gas or the like.

The polymerization reaction is preferably conducted under an inactive gas flow, preferably under a pressurization condition of 2 atm. or a higher pressure.

The polymerization reaction under the pressurization conditions is preferred because moisture and oxygen can be effectively prevented from admixing from outside the reaction vessel and the reaction process can be implemented at a comparatively low cost.

In a state without protection by the hydrophobic protective group, the block copolymer used in accordance with the present invention is a two-block copolymer of an AB system, a three-block copolymer of an ABA system or a BAB system, or a multiblock copolymer in which at least two hydrophilic blocks and at least two hydrophobic blocks are arranged alternately.

Each block A is a hydrophilic block composed of a repeating unit of a hydrophilic monomer, and each block B is a hydrophobic block composed of a repeating unit of a hydrophobic monomer.

In a block copolymer consisting of three or more blocks, a plurality of blocks A may be same or different in the same polymer, and a plurality of blocks B may be same or different in the same polymer. A two-block copolymer of an AB system is especially preferred.

A number-average molecular weight (Mn) of each block of the hydrophobic block and hydrophilic block that are hydrophobic or hydrophilic copolymers or homopolymers is preferably from 500 to 500,000, preferably from 500 to 100,000.

The molecular weight distribution (Mw/Mn) is preferably from 1.01 to 1.2, more preferably from 1.01 to 1.15.

It is known that a dry etching rate is low when the $N/(Nc-No)$ value of a monomer unit (here, N is a total number of atoms in the monomer unit, Nc is the number of carbon atoms in the monomer unit, and No is the number of oxygen atoms in the monomer unit) is small (Journal of Electrochemical Society, 130, 143 (1983)).

The $N/(Nc-No)$ value is typically called an Ohnishi parameter.

The dry etching rate of polymers including inorganic elements such as silicon, quartz, and metals cannot be estimated with this parameter.

When the block copolymer in accordance with the invention is unprotected with the hydrophobic protective group, it is preferred that the ratio of Ohnishi parameters of the hydrophilic block and hydrophobic block be as high as possible. A block copolymer with this parameter equal to or higher than 1.4 is especially preferred.

For example, an Ohnishi parameter of hydroxyethyl methacrylate and styrene is 6.33 and 2, respectively, and the ratio of Ohnishi parameters of the block copolymer in which the monomer of the hydrophilic block is hydroxyethyl methacrylate and the monomer of the hydrophobic block is styrene is 3.17. This block copolymer is especially preferred in accordance with the invention.

In a case where $O_2$ is used as a dry etching gas, it is preferred that a block copolymer be used that is composed of a block including an inorganic element such as silicon and an organic block containing not inorganic elements. Because compounds including inorganic elements have high resistance to $O_2$ plasma, a pattern with a high contrast can be obtained.

The hydrophilic functional group protected by the hydrophobic protective group in the block copolymer in accordance with the present invention preferably has a structure in which active hydrogen of the hydrophilic functional group is substituted by any of functional groups represented by the following Formulas (1) to (4).

(1) A nitrobenzyl group represented by Formula (1):
(Kagaku 1)

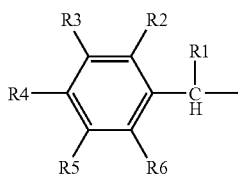

(1)

(in Formula (1), R1 is a hydrogen atom or an alkyl group; at least one of R2, R3, R4, R5, and R6 is a nitro group, and the other is selected from a group including a hydrogen atom, a halogen atom, an alkyl group, an alkoxy group, a phenyl group, a naphthyl group, and an alkyl group in which some or all hydrogen atoms are substituted with fluorine).

(2) A coumarinyl methyl group represented by Formula (2)
(Kagaku 2)

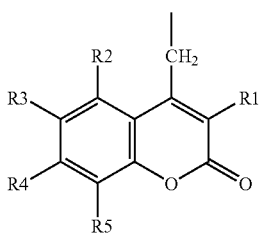

(2)

(in Formula (2), R1 to R5 are selected from a group including a hydrogen atom, a halogen atom, an alkyl group, an alkoxy group, an acetoxy group, a phenyl group, a naphthyl group, and an alkyl group in which some or all hydrogen atoms are substituted with fluorine).

(3) A benzoin group represented by Formula (3)
(Kagaku 3)

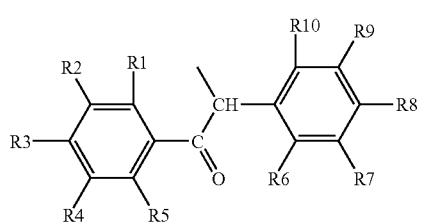

(3)

(in Formula (3), R1 to R10 are selected from a group including a hydrogen atom, a halogen atom, an alkyl group, an alkoxy group, a phenyl group, a naphthyl group, and an alkyl group in which some or all hydrogen atoms are substituted with fluorine).

(4) A fluorenecarbonyl group or xanthenecarbonyl group represented by Formula (4)
(Kagaku 4)

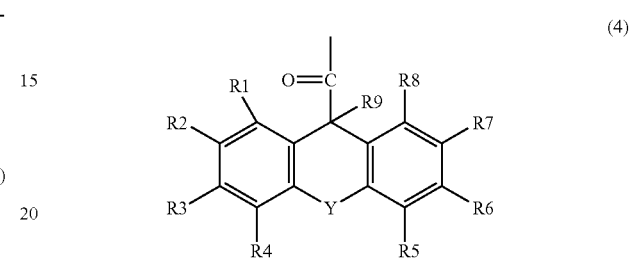

(4)

(in Formula (4), R1 to R8 are selected from a group including a hydrogen atom, a halogen atom, an alkyl group, an alkoxy group, an acetoxy group, a phenyl group, a naphthyl group, and an alkyl group in which some or all hydrogen atoms are substituted with fluorine. R9 is a hydrogen atom or a hydroxyl group. Y is an oxygen atom or a single bond).

The above-described nitrobenzyl group, coumarinyl methyl group, and benzoin group can be applied to a carboxyl group, a sulfo group, a hydroxyl group, and amino group. The above-described fluorenecarbonyl group and xanthenecarbonyl group can be applied to a hydroxyl group and an amino group.

The above-described hydrophobic protective group is known to decompose under the effect of light with a wavelength of about 200 nm to 400 nm, X-rays, and electron beam, thereby restoring the hydrophilic functional group (for example, "Protective Groups in Organic Synthesis, Third Edition", John Wiley & Sons, Inc., 1999).

A method for protecting the hydrophilic functional group of the hydrophilic monomer with the hydrophobic protective group is described below. In the block copolymer in accordance with the invention, all the blocks are preferably mutually compatible, although some hydrophilic functional groups may remain.

A block copolymer in accordance with the invention in which a hydrophilic functional group is protected by a nitrobenzyl group can be synthesized by a well-known condensation reaction of a nitrobenzyl derivative represented by Formula (5) below and a block copolymer having a carboxyl group, a sulfo group, a hydroxyl group, or an amino group in the hydrophilic block.

In the condensation reaction active hydrogen of the carboxyl group, sulfo group, hydroxyl group, or amino group is substituted by the nitrobenzyl group. The condensation reaction is carried out, for example, by a well-known method such as described in J. Org. Chem., 68, 9100 (2003) and J. Am. Chem. Soc., 110, 301 (1988).

(Kagaku 5)

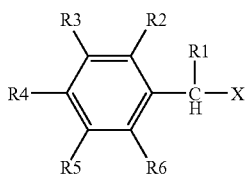

(5)

(in the formula, R1 to R6 have the same meaning as in Formula (1); X is a hydroxyl group or a halogen atom.

Specific examples of compounds represented by formula (5) are presented below.

2-Nitrobenzyl alcohol, 2-nitrobenzyl chloride, 2-nitrobenzyl bromide, 2-methyl-2-nitrobenzyl alcohol, 2-methyl-2-nitrobenzyl chloride, 2-methyl-2-nitrobenzyl bromide, 3-methyl-2-nitrobenzyl alcohol, 3-methyl-2-nitrobenzyl chloride, 3-methyl-2-nitrobenzyl bromide, 5-methyl-2-nitrobenzyl alcohol, 5-methyl-2-nitrobenzyl chloride, 5-methyl-2-nitrobenzyl bromide, 3-chloro-2-nitrobenzyl alcohol, 3-chloro-2-nitrobenzyl chloride, 3-chloro-2-nitrobenzyl bromide, 4-chloro-2-nitrobenzyl alcohol, 4-chloro-2-nitrobenzyl chloride, 4-chloro-2-nitrobenzyl brolmide, 5-chloro-2-nitrobenzyl alcohol, 5-chloro-2-nitrobenzyl chloride, 5-chloro-2-nitrobenzyl bromide, 4,5-dimethoxy-2-nitrobenzyl alcohol, 4,5-dimethoxy-2-nitrobenzyl chloride, 4,5-dimethoxy-2-nitrobenzyl bromide, 5-(3-iodopropoxy)-2-nitrobenzyl alcohol, 5-(3-iodopropoxy)-2-nitrobenzyl chloride, and 5-(3-iodopropoxy)-2-nitrobenzyl bromide.

A block copolymer in accordance with the invention in which a hydrophilic functional group is protected by a coumarinyl methyl group can be synthesized by a well-known condensation reaction of a coumarin derivative represented by Formula (6) below and a block copolymer having a carboxyl group, a sulfo group, a hydroxyl group, or an amino group in the hydrophilic block.

In the condensation reaction active hydrogen of the carboxyl group, sulfo group, hydroxyl group, or amino group is substituted by the coumarinyl methyl group.

(Kagaku 6)

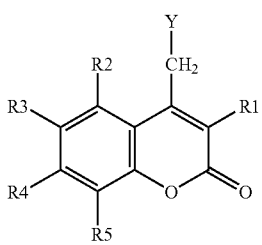

(6)

(in the formula, R1 to R5 have the same meaning as in Formula (2); Y is a halogen atom.

Specific examples of the compounds represented by Formula (6) include 4-(bromomethyl)umbelliferyl acetate, 4-bromomethyl-6,7-dimethoxycoumarin, 4-bromomethyl-7-methoxycoumarin, 4-chloromethyl-6-methylcoumarin.

Furthermore, the compound represented by Formula (6) can be synthesized by halogenizing the methyl group in the 4 position of a 4-methylcoumarin derivative.

Examples of the 4-methylcoumarin derivative include 7-dimethylamino-4-methylcoumarin, 7-diethylamino-4-methylcoumarin, 4,6-dimethylcoumarin, 7-ethoxy-4-methylcoumarin, 6-ethyl-7-methoxy-4-methylcoumarin, and 5,7-dimethoxy-4-methylcoumarin.

A block copolymer in accordance with the invention in which a hydrophilic functional group is protected by a benzoin group can be synthesized by a well-known condensation reaction of a benzoin derivative represented by Formula (7) below and a block copolymer having a carboxyl group, a sulfo group, a hydroxyl group, or an amino group in the hydrophilic block.

In the condensation reaction active hydrogen of the carboxyl group, sulfo group, hydroxyl group, or amino group is substituted by the benzoin group.

(Kagaku 7)

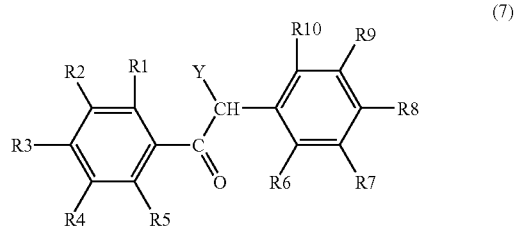

(7)

(in the formula, R1 to R10 have the same meaning as in Formula (3). Y is a hydroxyl group or a halogen atom).

Specific examples of compounds represented by Formula (7) are shown below.

Benzoin, 2-hydroxy-2-(4-methylphenyl)-1-phenylethanone, 2-hydroxy-1,2-diphenyl-1-propanone, 2-hydroxy-1-(4-methylphenyl)-2-phenylethanone, 4,4'-dimethylbenzoin, piperoin, 4,4'-dimethoxybenzoin, 4-(dimethylamino)benzoin, 1-(4-(dimethylamino)phenyl)-2-hydroxy-2-(4-methylphenyl)ethanone, 1,2-bis(4-bromophenyl)-2-hydroxyethanone, 2,2',6,6'-tetrachlorobenzoin, and 4-(diphenylphosphinoyl)-2-hydroxy-1,2-diphenylbutane-1-one.

A block copolymer in accordance with the invention in which a hydrophilic functional group is protected by a fluorenecarbonyl group or xanthenecarbonyl group can be synthesized by a well-known condensation reaction of a fluorenecarboxylic acid derivative or xanthenecarboxylic acid derivative represented by Formula (8) below and a block copolymer having a hydroxyl group, or an amino group in the hydrophilic block.

In the condensation reaction, active hydrogen of hydroxyl group, or amino group is substituted to the fluorenecarbonyl group or xanthenecarbonyl group.

(Kagaku 8)

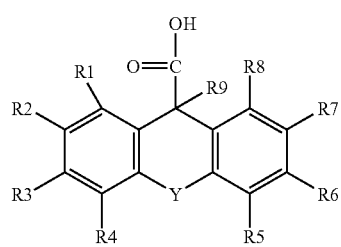

(8)

(in the formula R1 to R9 and Y have the same meaning as in Formula (4)).

Specific examples of compounds represented by Formula (8) include fluorenecarboxylic acid, 9-hydroxyfluorenecarboxylic acid, chlorflurenol, and xanthenecarboxylic acid.

Specific examples of the method for forming a microphase-separated structure and the substrate processing method in accordance with the present invention will be described below.

The adequate substrate can be selected according to a fabrication process of the target device.

In a specific example, a semiconductor substrate from Si, GaAs, and InP and a dielectric substrate from glass, quartz, and BN are used, and a film of one material or a plurality of materials selected from resists, spin-on-glass, metals, oxides, nitrides, and magnetic materials is formed as an intermediate layer on these substrates.

A block copolymer is dissolved in a solvent to prepare a coating solution, and the coating solution is coated by a spin coating method or a dip coating method on the substrates to form a film. The solvent is preferably a good solvent with respect to each block of the block copolymer The substrates are heated at a temperature equal to or lower than a thermal decomposition temperature (about 110° C. to 150° C.) of the hydrophobic protective substrate and the solvent contained in the film is evaporated.

In this case, the film thickness after heating is preferably ½ to 5 times, more preferably ½ to 2 times the period of the phase-separated structure. A well-known heating means such as an oven or hot plate can be used for heating.

The block copolymer layer in accordance with the invention that has been formed in the above-described manner is exposed according to a desired pattern by using a well-known exposure device. A photomask may be used for the pattern exposure. Direct lithography using a laser or electron beam may be also performed. The hydrophobic protective group of the exposure portion is dissociated by the exposure, and the hydrophilic functional group is restored.

Light with a wavelength of 200 nm to 400 nm or radiation such as X-rays and electron beam can be appropriately selected and used as the radiation for exposure. Because an exposure device using a mercury lamp (wavelength 436 nm, 365 nm, 254 nm) is inexpensive, it is especially preferred that this device be used.

Radiation of one type or a plurality of types can be used.

A microphase-separated structure can be formed only in the exposed portion by annealing the film at a temperature that is equal to or higher than the glass transition temperature of the block copolymer that has not been protected with the hydrophobic protective group and equal to or lower than the thermal decomposition temperature (about 110° C. to 150° C.) of the hydrophobic protective group.

A well-known heating means such as an oven or hot plate can be used for annealing.

Dry etching, ozone ashing, or energy beam irradiation is used to remove selectively only one block. The energy beam is preferably electron beam, X-rays, γ rays, and heavy particle beam, especially preferably electron beam.

Examples of etching gases that are used during dry etching include Ar, $O_2$, $CF_4$, $H_2$, $C_2F_6$, $CHF_3$, $CH_2F_2$, $CF_3Br$, $N_2$, $NF_3$, $Cl_2$, $CCl_4$, HBr, and $SF_6$.

The trend in etching rate determined by the above-described Ohnishi parameter is known to be practically independent of the etching gas type.

Where a block copolymer is used that is composed of a block including an inorganic element such as silicon and an organic block containing no inorganic element, $O_2$ is preferably used as the dry etching gas.

The substrate can be processed by etching the underlying substrate or an intermediate layer located on the underlying substrate by using the block that has been left on the substrate in the above-described process and the block copolymer layer remaining on the unexposed portion.

A lithographic process using an intermediate layer composed of an organic material as a mask, such as described in Appl. Phys. Lett., 79, 257 (2001), may be also applied.

With the substrate processing method in accordance with the invention, a micropattern can be formed on a substrate at a low cost by using the phase-separation property of the block copolymer in which a microphase-separated structure can be position-selectively formed by using an ultraviolet exposure device. Therefore, such a method can be used for producing photonic crystals having a light waveguide.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-154647, filed Jun. 12, 2008, which is hereby incorporated by reference herein in its entirety.

What is claimed is:

1. A block copolymer comprising as a basic skeleton a hydrophobic block that has a repeating structure of a hydrophobic monomer and a hydrophilic block that has a repeating structure of a hydrophilic monomer having a hydrophilic functional group, wherein at least some of the hydrophilic functional groups are covered with a hydrophobic protective group and the hydrophobic protective group is dissociated from the hydrophilic functional group by light irradiation and phase separation occurs on the basis of the hydrophobic block and the hydrophilic block.

2. The block copolymer according to claim 1, wherein the hydrophilic block covered with the hydrophobic protective group and the hydrophobic block are mutually compatible.

3. The block copolymer according to claim 1, wherein the hydrophobic protective group is a nitrobenzyl group in which some hydrogen atoms may be substituted with a halogen element or an alkyl group.

4. The block copolymer according to claim 1, wherein the hydrophobic protective group is a coumarinyl methyl group in which some hydrogen atoms may be substituted with a halogen element or an alkyl group.

5. The block copolymer according to claim 1, wherein the hydrophobic protective group is a benzoin group in which some hydrogen atoms may be substituted with a halogen element or an alkyl group.

6. The block copolymer according to claim 1, wherein the hydrophobic protective group is a fluorenecarbonyl group in which some hydrogen atoms may be substituted with a halogen element or an alkyl group.

7. The block copolymer according to claim 1, wherein the hydrophobic protective group is a xanthenecarbonyl group in which some hydrogen atoms may be substituted with a halogen element or an alkyl group.

8. A method for processing a substrate, comprising:
coating the block copolymer according to claim 1 on the substrate;
exposing by selectively irradiating the block copolymer with radiation;
performing a heat treatment at a temperature that is equal to or higher than a glass transition temperature of the hydrophobic block and the hydrophilic block of the block copolymer and equal to or lower than a thermal decomposition temperature of the hydrophobic protective group that covers the hydrophilic functional group and performing phase separation, on the basis of the hydrophobic block and the hydrophilic block, of the region where the block copolymer has been exposed;
selectively removing one block from among the phase-separated hydrophobic block and hydrophilic block; and
processing the substrate by using as a mask the other block that remains on the substrate.

* * * * *